(12) United States Patent
Morita et al.

(10) Patent No.: US 7,712,652 B2
(45) Date of Patent: May 11, 2010

(54) COMPONENT MOUNTING APPARATUS AND COMPONENT MOUNTING METHOD

(75) Inventors: Takeshi Morita, Fukuoka (JP); Masanori Hiyoshi, Fukuoka (JP)

(73) Assignee: Panasonic Corporation, Osaka (JP)

( * ) Notice: Subject to any disclaimer, the term of this patent is extended or adjusted under 35 U.S.C. 154(b) by 183 days.

(21) Appl. No.: 11/743,812

(22) Filed: May 3, 2007

(65) Prior Publication Data

US 2007/0262118 A1 Nov. 15, 2007

(30) Foreign Application Priority Data

May 10, 2006 (JP) .............................. 2006-131363

(51) Int. Cl.
*B23K 31/00* (2006.01)
*B23K 31/02* (2006.01)
(52) U.S. Cl. ........................... 228/180.22; 228/180.21; 228/246; 29/740; 29/741; 29/832
(58) Field of Classification Search ........................ 228/180.21–180.22; 29/739, 740, 840, 832; 427/97.3, 427/97.4, 98.4, 98.6
See application file for complete search history.

(56) References Cited

U.S. PATENT DOCUMENTS

| | | | | |
|---|---|---|---|---|
| 5,894,657 A | * | 4/1999 | Kanayama et al. | 29/740 |
| 6,389,683 B1 | * | 5/2002 | Mori et al. | 29/740 |
| 6,479,321 B2 | * | 11/2002 | Wang et al. | 438/109 |
| 6,857,361 B2 | * | 2/2005 | Sakai et al. | 101/129 |
| 2003/0136441 A1 | * | 7/2003 | Tanaka | 136/256 |

FOREIGN PATENT DOCUMENTS

JP 2000-022394 1/2000

* cited by examiner

*Primary Examiner*—Jessica L. Ward
*Assistant Examiner*—Devang Patel
(74) *Attorney, Agent, or Firm*—Pearne & Gordon LLP

(57) ABSTRACT

First components and second components in which bumps are formed on the lower surface thereof and laminate structures are formed by mounting them to stack with each other on a circuit board 13 are picked up from a component supply unit 1 using a placement head 16, and by lifting and lowering the placement head 16 holding the first components and the second components relative to a paste transfer device 5 supplying a flux 10 in the manner such as coating films having two types of different thicknesses, the flux 10 is supplied to the bumps of the plurality of components in a bundle using a transfer coating method. With such a configuration, it is possible to efficiently perform a component mounting with a satisfactory adhesiveness by ensuring an optimal amount of application quantity of a paste.

3 Claims, 12 Drawing Sheets

1: COMPONENT SUPPLY UNIT
5: PASTE TRANSFER DEVICE
6: MOVING TABLE
7: TRANSFER TABLE
9A: FIRST SQUEEGEE MEMBER (COATING FILM FORMING MEMBER)
9B: SECOND SQUEEGEE MEMBER (COATING FILM FORMING MEMBER)
10: FLUX (PASTE)
11: CIRCUIT BOARD HOLDING UNIT
13: CIRCUIT BOARD
14: COMPONENT PLACING MECHANISM
15: HEAD MOVING MECHANISM
16: PLACEMENT HEAD
17A: FIRST SUCTION NOZZLE
17B: SECOND SUCTION NOZZLE

1: COMPONENT SUPPLY UNIT
5: PASTE TRANSFER DEVICE
6: MOVING TABLE
7: TRANSFER TABLE
9A: FIRST SQUEEGEE MEMBER (COATING FILM FORMING MEMBER)
9B: SECOND SQUEEGEE MEMBER (COATING FILM FORMING MEMBER)
10: FLUX (PASTE)

11: CIRCUIT BOARD HOLDING UNIT
13: CIRCUIT BOARD
14: COMPONENT PLACING MECHANISM
15: HEAD MOVING MECHANISM
16: PLACEMENT HEAD
17A: FIRST SUCTION NOZZLE
17B: SECOND SUCTION NOZZLE

7a: COATING FILM FORMING SURFACE
22: DIRECT OPERATED MECHANISM
23A: FIRST SQUEEGEE LIFTING AND LOWERING MECHANISM
23B: SECOND SQUEEGEE LIFTING AND LOWERING MECHANISM
g: COATING FILM FORMING GAP 10a, 10b: COATING FILM

COMPONENT MOUNTING APPARATUS AND COMPONENT MOUNTING METHOD

BACKGROUND OF THE INVENTION

The present invention relates to a component mounting apparatus and method for mounting, on a circuit board, electronic components in which bumps are formed on the lower surface thereof.

As a method of mounting electronic components such as semiconductor elements on a circuit board, there has been used a mounting method in which a semiconductor package having semiconductor elements mounted on a resin substrate is mounted on the circuit board by a solder bonding method using solder bumps. In the solder bonding method of bonding the electronic components onto the circuit board using the solder bumps, the bonding is generally conducted in such a manner that the solder bumps are landed onto electrodes formed on the circuit board in the state that an auxiliary substance for soldering such as a flux or a solder paste is supplied to the solder bumps. For this reason, a paste transfer device for transferring the flux or the solder paste is disposed in such a component mounting apparatus for the semiconductor package (see, Patent Document 1 for example). In the example shown in Patent Document 1, a paste coating film having a predetermined thickness is formed on an outer periphery of a rotatable roller, and solder bumps are brought into contact with the past coating film by allowing the solder bumps to be in contact with the coating film, thereby coating the solder bumps with the paste.

Patent Document 1: JP-A-2000-022394

Incidentally, components simultaneously mounted on the same circuit board by a component mounting apparatus are not always of the same type, but sometimes different types of components may be mounted on the same circuit board. For example, in the case where a plurality of semiconductor packages are laminated onto each other on the circuit board, optimal quantities of flux to be transferred onto the semiconductor packages are different from each other, and thus a paste transfer device needs to form flux coating films having different thicknesses at the same time. Additionally, in the case where the types of the components to be mounted are changed, it is necessary to adjust the thicknesses of the coating films to have optimal thicknesses in correspondence to the components.

However, since the known paste transfer device including the above-mentioned example disclosed in Patent Document 1 cannot form coating films having arbitrarily different thicknesses at the same time, bumps cannot be coated with an optimal amount of the flux at the time of transferring the flux thereto. For this reason, excessively insufficient amount of flux is applied depending on the type of components, thereby enabling to acquire a satisfactory soldering result.

SUMMARY OF THE INVENTION

Therefore, the present invention provides a component mounting apparatus and a component mounting method capable of simultaneously forming the coating films having different thicknesses and efficiently performing a component mounting with a satisfactory adhesiveness by ensuring the bump to be coated with the optimal amount of the paste.

According to an aspect of the invention, there is provided a component mounting apparatus for mounting a component in which bumps are formed on the lower surface thereof on a circuit board, and the apparatus includes a component supply unit which supplies a plurality of components, a circuit board holding unit which holds and positions the circuit board, a placement head which picks up the plurality of components from the component supply unit and places the plurality of components onto the circuit board held by the circuit board holding unit, head moving means which moves the placement head to the component supply unit and the circuit board holding unit, and a paste transfer device which is disposed in a movement path of the placement head and supplies a paste with which the bumps of the plurality of components held by the placement head are coated by a transfer coating method in the form of coating films having at least two different thicknesses, in which in the course of the movement of the placement head holding the plurality of components from the component supply unit to the circuit board holding unit, the paste is applied to the bumps of the plurality of components in a bundle using the transfer coating method by lifting and lowering the plurality of components held by the placement head relative to the paste transfer device.

According to another aspect of the invention, there is provided a component mounting method of mounting a component on a circuit board using a component mounting apparatus including a component supply unit which supplies a plurality of components in which bumps are formed on the lower surface thereof, a circuit board holding unit which holds and positions the circuit board, a placement head which picks up the plurality of components from the component supply unit and places the plurality of components onto the circuit board held by the circuit board holding unit, head moving means which moves the placement head to the component supply unit and the circuit board holding unit, and a paste transfer device which is disposed in a movement path of the placement head and supplies a paste with which the bumps of the plurality of components held by the placement head are coated using a transfer coating method in the form of coating films having at least two different thicknesses, and the component mounting method including a coating film forming step of forming the coating films of the paste with different thicknesses set to correspond to the plurality of components, respectively, by the use of the paste transfer device, a component pickup step of picking up the plurality of components from the component supply unit by the use of the placement head, a paste transfer step of transferring the paste to solder bumps of the plurality of components in a bundle by lifting and lowering the plurality of components held by the placement head relative to the paste transfer device in the course of the movement of the placement head holding the plurality of components from the component supply unit to the circuit board holding unit, and a component placing step of placing the plurality of components to which the paste has been transferred onto the circuit board.

Since the component mounting apparatus according to the present invention is configured such that the component mounting apparatus includes the paste transfer device which supplies the paste having at least two different thicknesses onto the bumps of a plurality of components held by the placement head, and the paste is applied to the bumps of the plurality of components in a bundle using the transfer coating method by lowering the plurality of components held by the placement head in the course of the movement of the placement head holding the plurality of components from the component supply unit to the circuit board holding unit, it is possible to form the coating films having different arbitrary thicknesses at the same time and ensure an optimal application amount of the paste, thereby efficiently performing the component mounting with a satisfactory adhesiveness.

DETAILED DESCRIPTION OF THE PREFERRED EMBODIMENTS

Hereinafter, an embodiment of the invention will be described with reference to the drawings.

Figure 1:
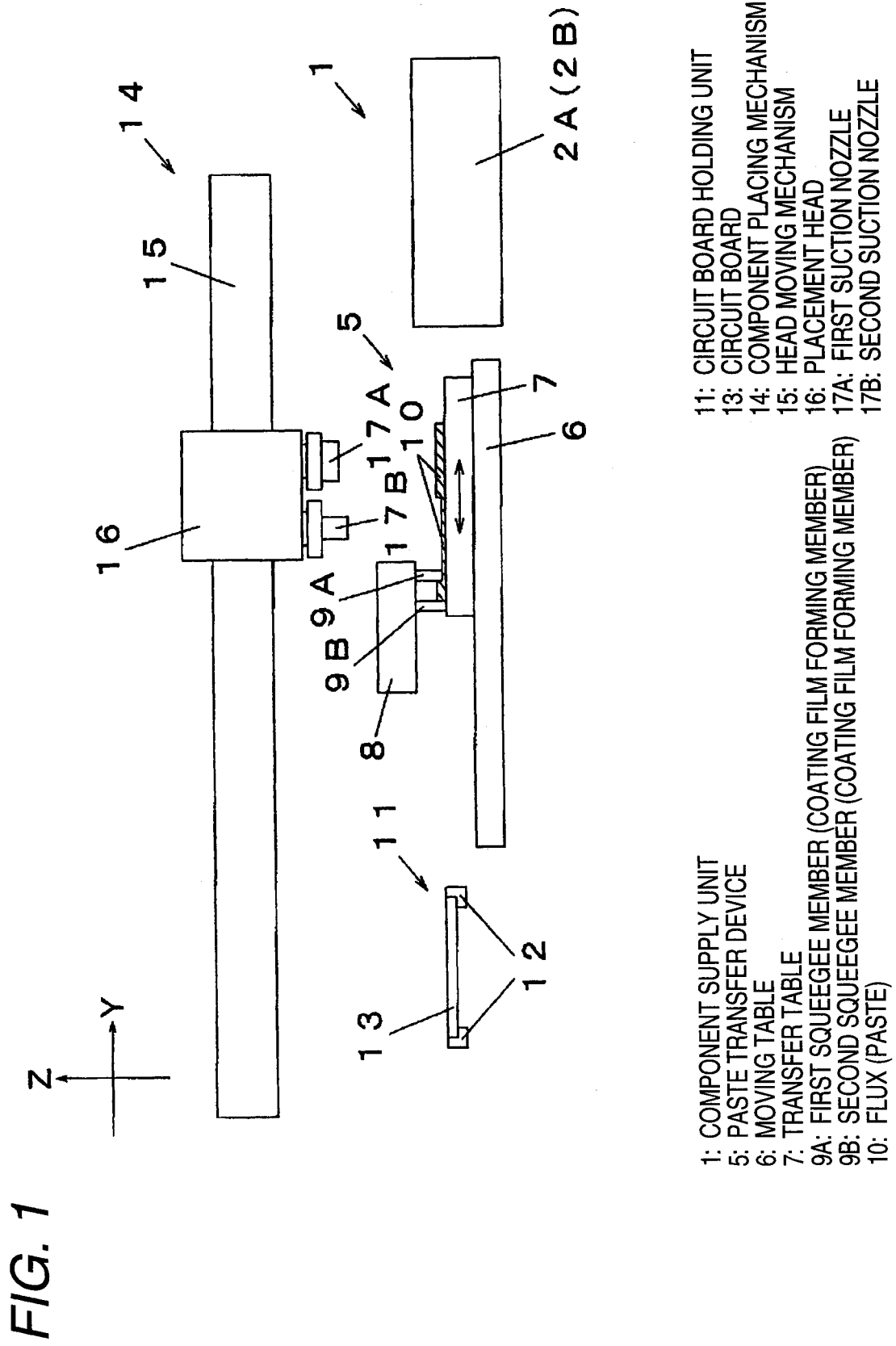
FIG. 1 is a front view illustrating a component mounting apparatus in accordance with an embodiment of the invention.
Figure 2:
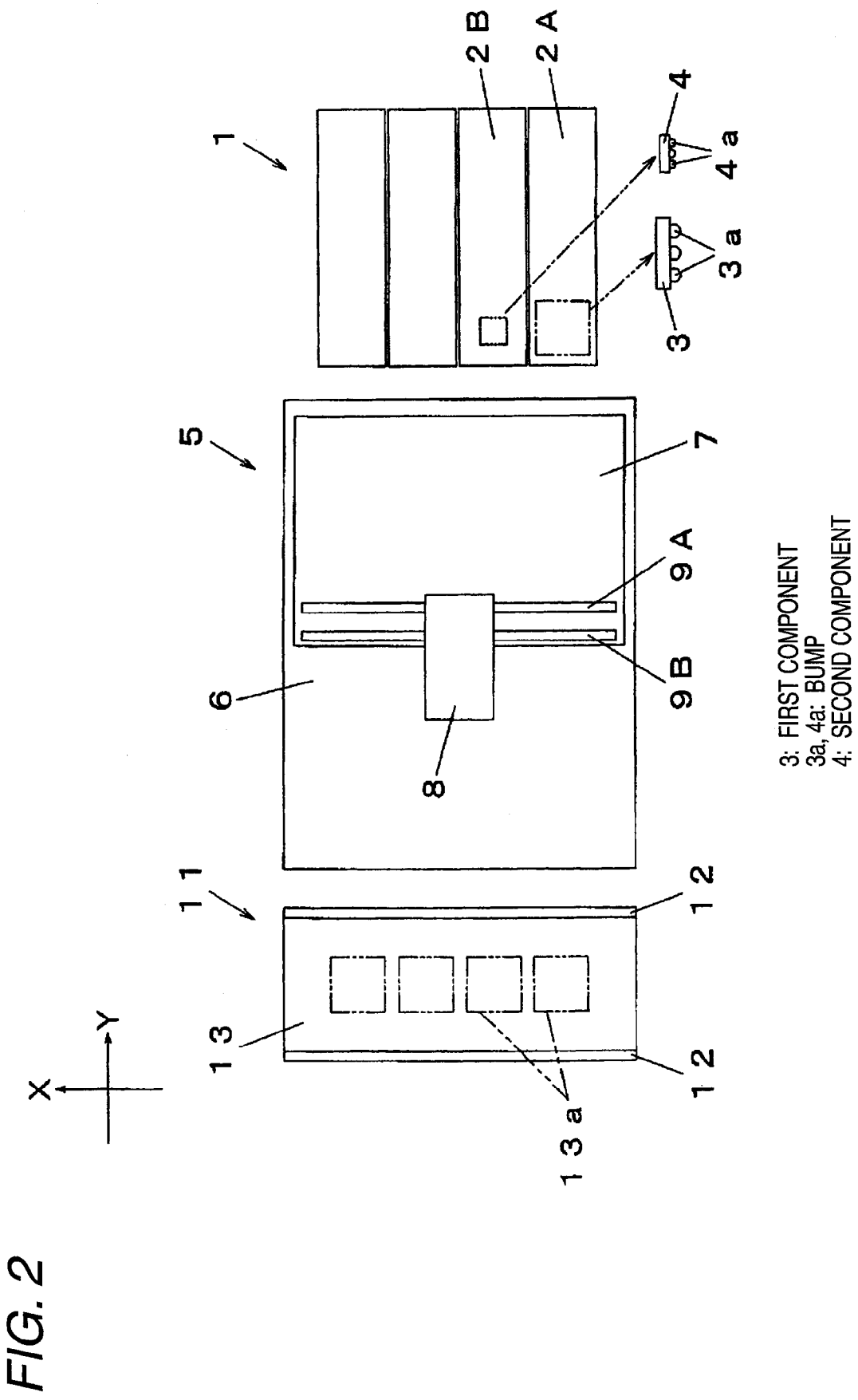
FIG. 2 is a top plan view illustrating the component mounting apparatus in accordance with the embodiment of the invention.

Moreover, a structure of the component mounting apparatus will be described with reference to FIGS. 1 and 2. The component mounting apparatus has a function of mounting components such as a semiconductor package in which a bump is formed on the lower surface thereof on a circuit board. As shown in FIGS. 1 and 2, the component mounting apparatus is configured that a component supply unit 1, a paste transfer device 5, and a circuit board holding unit 11 are two-dimensionally arranged in Y direction and a component placing mechanism 14 is disposed above them. In the specification, a circuit board conveying direction of the circuit board holding unit 11 is defined as X direction.

A plurality of components feeder including a first components feeder 2A and a second components feeder 2B are disposed in the component supply unit 1, and the first components feeder 2A and the second components feeder 2B supply a first components 3 and a second components 4, respectively. The first components 3 and the second components 4 have bumps 3a and 4a formed of a solder on the lower surfaces thereof, respectively. In the embodiment, by placing these components onto the circuit board to stuck with each other, laminated structures in which the second components 4 are placed on the first components 3 are formed.

The paste transfer device 5 is disposed at the side of the component supply unit 1. The paste transfer device 5 is configured that a transfer table 7 is disposed on an upper surface of a moving table 6 so as to be horizontally movable in Y direction and a squeegee unit 8 is immovably disposed above the transfer table 7. The squeegee unit 8 includes a first squeegee member 9A and a second squeegee member 9B, and has a function of forming a coating film of a flux 10 acting as a paste on an upper surface of the transfer table 7. The circuit board holding unit 11 includes a transfer rail 12 disposed in X direction, and determines its position by supporting the circuit board 13 conveyed from a device in an upstream side.

Figure 3A:
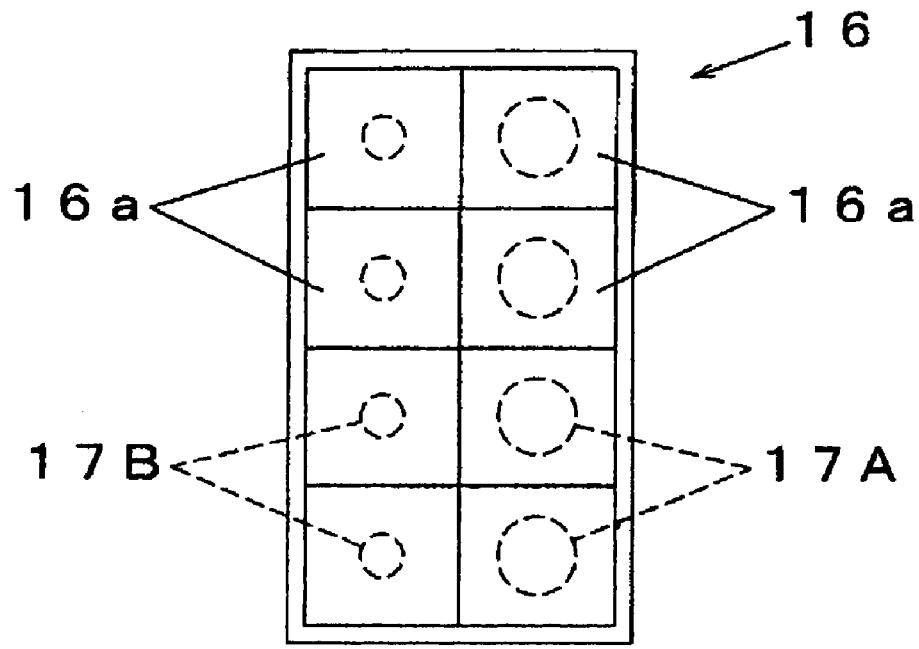
FIGS. 3A and 3B are views illustrating configurations of a placement head in the component mounting apparatus in accordance with the embodiment of the invention.
Figure 3B:
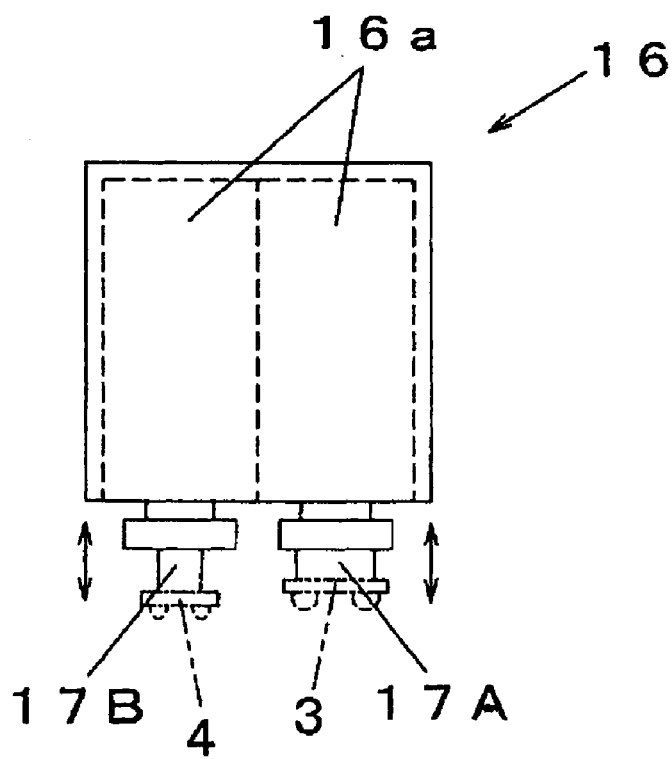

A component placing mechanism 14 provided with a placement head 16 is disposed above the component supply unit 1, the paste transfer device 5, and the circuit board holding unit 11, and the placement head 16 is horizontally movable in X and Y directions by the use of a head moving mechanism 15 acting as head moving means. As shown in FIG. 3A, the placement head 16 is a multiple type of a head provided with a plurality (herein, the placement head 16 is formed of eight unit placement heads 16a) of unit placement heads 16a, and specifically a half of these unit placement heads 16a are equipped with first suction nozzles 17A and a half of these unit placement heads 16a are equipped with second suction nozzles 17B. The first suction nozzles 17A and the second suction nozzles 17B are able to be lifted and lowered by the use of a lifting and lowering mechanism built in the unit placement heads 16a, respectively. As shown in FIG. 3B, the first suction nozzles 17A and the second suction nozzles 17B are able to suck and hold the first components 3 and the second components 4, respectively.

A component mounting operation is performed in terms of a combination of a horizontal movement in X and Y directions of the placement head 16 by the use of the head moving mechanism 15 and lifting and lowering operations of the first suction nozzles 17A and the second suction nozzles 17B. Namely, the placement head 16 picks up a plurality of first components 3 and a plurality of second components 4 out of a first components feeder 2A and a second components feeder 2B and transfers the plurality of first components 3 and second components 4 to the circuit board holding unit 11 by the use of the first suction nozzles 17A and the second suction nozzles 17B, and the placement head 16 places the plurality of first components 3 and second components 4 on components mounting positions 13a of the circuit board 13 in the transfer rail 12 so as to stuck with each other.

Figure 4A:
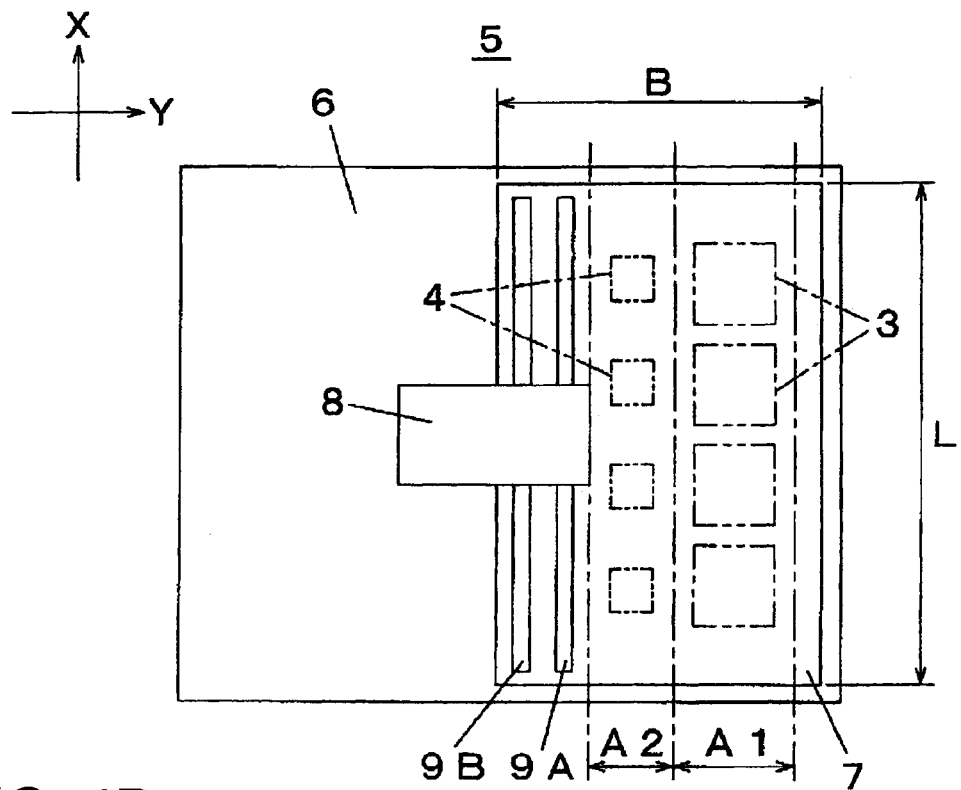
FIGS. 4A and 4B are views illustrating structures of a paste transfer device in the component mounting apparatus in accordance with the embodiment of the invention.
Figure 4B:
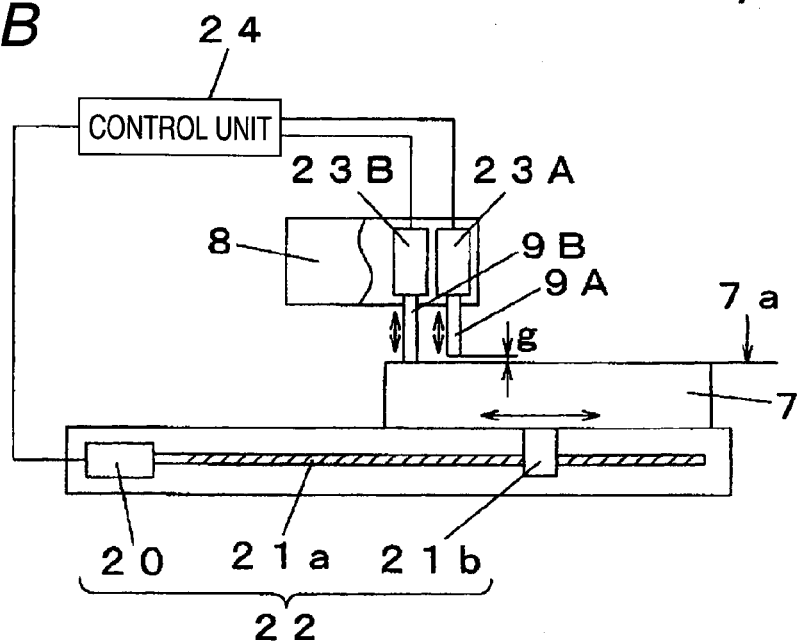

Next, a function and structure of the paste transfer device 5 will be described. The paste transfer device 5 is disposed in a moving path of the placement head 16 using the head moving mechanism 15, and has a function of supplying the flux 10 using a transfer coating method in such a manner of a coating film having at least two types of different film thicknesses to the bumps 3a and 4a of the plurality of first components 3 and second components 4 held by the placement head 16. As shown in FIGS. 4A and 4B, the transfer table 7 is disposed on the upper surface of the moving table 6 so as to be horizontally movable in Y direction. As shown in FIG. 4B, the transfer table 7 is reciprocated in Y direction by a direct operated mechanism 22 including a motor 20, a feed screw 21a, and a nut 21b built in the moving table 6, and an operation of the direct operated mechanism 22 is performed by the control unit 24 controlling the motor 20.

A flat and wide coating film forming surface 7a for forming the coating film of the flux 10 is formed on the upper surface of the transfer table 7. The coating film forming surface 7a is formed into a flat surface of a rectangular shape having a long side and a short side, that is, this is formed that an X-direction dimension L is larger than a Y-direction dimension B. Herein, the coating film forming surface 7a is formed to have a shape and dimension to allow the coating film having such a planar surface size that the coating film is simultaneously transferred onto the plurality (herein, the number of components 3 and 4 held by a single placement head 16 is four, respectively) of first components 3 and second components 4 held by the respective unit placement heads 16a of the placement head 16 in which coating film forming areas A1 and A2 are set to correspond to the four first components 3 and the four second components 4 on the coating film forming surface 7a, respectively.

Namely, the transfer table 7 is formed so that the plurality of first components 3 and second components 4 held by the placement head 16 are two-dimensionally disposed on the surface thereof. With such a configuration, in the course of a movement of the placement head 16 holding the plurality of first components 3 and second components 4 from the component supply unit 1 to the circuit board holding unit 11, the plurality of first components 3 and second components 4 held by the placement head 16 are lifted and lowered relative to the paste transfer device 5, whereby the bumps 3a and 4a of the plurality of first components 3 and second components 4 are together coated with the flux 10 using a transfer coating method.

A squeegee unit 8 having a first squeegee member 9A and a second squeegee member 9B is disposed above the transfer table 7. All of the first squeegee member 9A and the second squeegee member 9B are formed to have a length to substantially cover the X-direction dimension L of the coating film forming surface 7a, and made to be lifted and lowered by a first squeegee lifting and lowering mechanism 23A and a second squeegee lifting and lowering mechanism 23B built in the squeegee unit 8, that is, made to be moved toward or away from the coating film forming surface 7a.

The first squeegee lifting and lowering mechanism 23A and the second squeegee lifting and lowering mechanism 23B are controlled by the control unit 24, and lifting and lowering positions of the first squeegee member 9A and the second squeegee member 9B can be finely manipulated. With such a configuration, the first squeegee member 9A and the second squeegee member 9B are able to maintain (see the first squeegee member 9A as shown in FIG. 4B for reference) a predetermined coating film forming gap g between a lower end portion thereof and the coating film forming surface 7a, and the lower end portion thereof are able to be in sliding contact (see the second squeegee member 9B as shown in FIG. 4B for reference) with the coating film forming surface 7a. Namely, the first squeegee member 9A and the second squeegee member 9B are formed of film forming members disposed to maintain the coating film forming gap g between the lower end portion and the coating film forming surface 7a.

The flux 10 is provided on the coating film forming surface 7a, and the first squeegee member 9A and the second squeegee member 9B are relatively moved in a horizontal direction relative to the transfer table 7 by driving the direct operated mechanism 22 to allow the transfer table 7 to be horizontally moved in the state where the first squeegee member 9A and the second squeegee member 9B are maintained in the position as shown in FIG. 4B, whereby a coating film forming operation of forming the coating film of the flux 10 having the thicknesses set to correspond to the coating film forming gap g is performed on the coating film forming surface 7a.

Accordingly, coating film forming operation means for performing the coating film operation of forming the coating film of the flux 10 having the thicknesses set to correspond to the coating film forming gap g is configured by the direct operated mechanism 22, for horizontally moving the transfer table 7, relatively moving the first squeegee member 9A and the second squeegee member 9B acting as the coating film forming members in a horizontal manner relative to the transfer table 7. In the coating film forming operation, since the first squeegee member 9A and the second squeegee member 9B move in Y direction, that is, in the direction of the short side of the rectangle on the coating film forming surface 7a, a moving distance during the one-time coating film forming operation is shortened, thereby enabling the necessary time of the coating film forming operation to be shortened.

At this time, by allowing the motor 20, the first squeegee lifting and lowering mechanism 23A, and the second squeegee lifting and lowering mechanism 23B to be controlled by the control unit 24, the lifting and lowering positions of the first squeegee member 9A and the second squeegee member 9B are able to be controlled in synchronization with a horizontal movement of the transfer table 7. With such a configuration, the coating film forming gap g can be arbitrarily changed in correspondence to a position in Y direction on the coating film forming surface 7a, whereby a thickness t of a paste coating film can be adjusted to be a desired thickness. Namely, the control unit 24, the first squeegee lifting and lowering mechanism 23A, and the second squeegee lifting and lowering mechanism 23B are made to be used as thickness adjusting means for adjusting the thickness of the paste coating film by changing the coating film forming gap.

Figure 5A:
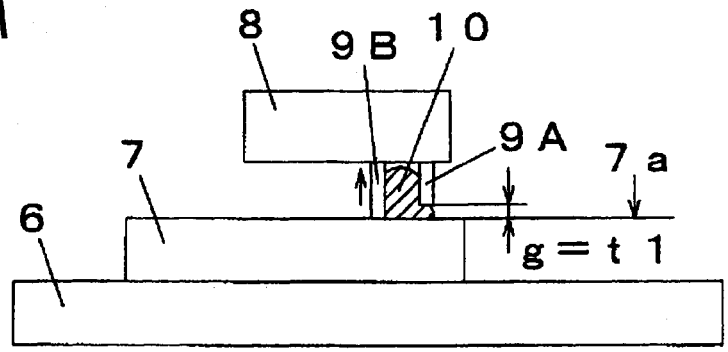
FIGS. 5A to 5D are views illustrating operations of the paste transfer device in the component mounting apparatus in accordance with the embodiment of the invention.

Next, the coating film forming operation and a coating film scraping operation performed by the paste transfer device 5 will be described with reference to FIGS. 5A to 5D and 6A to 6D. Above all, FIG. 5A shows a state that the first squeegee member 9A and the second squeegee member 9B are positioned at an end portion of a coating film forming start side (a right end portion in case of this example) and the flux 10 is supplied between the first squeegee member 9A and the second squeegee member 9B on the coating film forming surface 7a before starting the coating film forming operation. Herein, an example of forming the coating film using the first squeegee member 9A is described. At the time of starting the coating film forming operation, the coating film forming gap g between the lower end portion of the first squeegee member 9A and the coating film forming surface 7a is set to be a thickness t1 so that the flux 10 is optimally transferred to the bump 3a of the first components 3, and the second squeegee member 9B is lifted so as not to disturb a flow of the flux 10 at the time of forming the coating film.

Figure 5B:
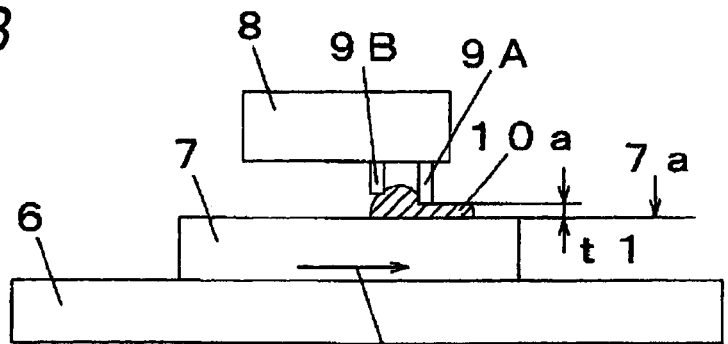
Figure 5C:
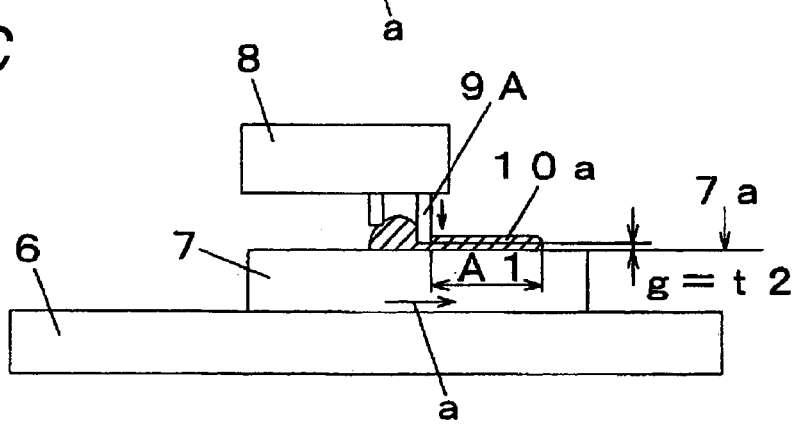

Subsequently, by driving the direct operated mechanism 22 (see FIG. 4B for reference) built in the moving table 6, the transfer table 7 is moved in the direction of an arrow a as shown in FIG. 5B. With such a configuration, the flux 10 is spread by the first squeegee member 9A on the coating film forming surface 7a, and a coating film 10a having the thickness t1 is formed on the coating film forming surface 7a. Additionally, as shown in FIG. 5C the thicknesses is adjusted at the time when the coating film 10a having a width set to correspond to the coating film forming area A1 as shown in FIG. 4A is formed. Namely, by controlling the first squeegee lifting and lowering mechanism 23A using the control unit 24, the first squeegee member 9A is slightly lowered so that the coating film forming gap g between the lower end portion of the first squeegee member 9A and the coating film forming surface 7a is changed to a thickness t2 allowing the optimal flux 10 to be transferred to the bumps 4a of the second components 4.

Figure 5D:
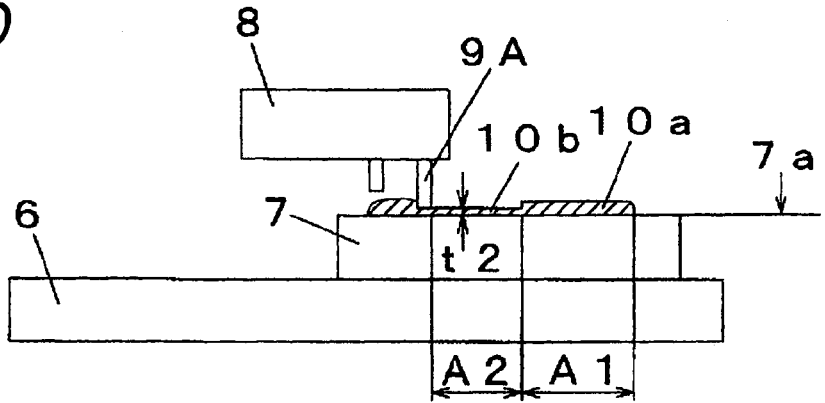

Then, by moving again the transfer table 7 in the direction of the arrow a, the coating film 10b having the thickness t2 is formed on the coating film forming surface 7a. As shown in FIG. 5D, by forming the coating film 10b having a width set to correspond to the coating film forming area A2 as shown in FIG. 4B, the coating film forming operation is completed. Namely, in the embodiment, during the coating film forming operation, the coating film forming gap g is changed by the thickness adjusting means, whereby the coating film having the thicknesses t1 and t2 set to correspond to the plurality of first components 3 and second components 4 held by the placement head 16 is formed on the coating film forming surface 7a.

Additionally, in the above-mentioned example of the coating film forming operation, an example that the coating film is formed by the first squeegee member 9A is illustrated, but the coating film may be formed by the second squeegee member 9B. In this case, an end portion of the left side on the coating film forming surface 7a is set to be an end portion of a coating film forming start side, and by moving the transfer table 7 in an opposite direction to the arrow a, the coating film of the flux 10 is formed on the coating film forming surface 7a in the same way as above.

In the above-mentioned example of the coating film forming operation, two types of coating films having different thicknesses are formed into a stair shape, but coating films whose thicknesses vary in multiple steps in level may be formed. In addition, by controlling the motor 20, the first squeegee lifting and lowering mechanism 23A, and the second squeegee lifting and lowering mechanism 23B to be in synchronization with one another using the control unit 24, the coating film may be formed such that the thicknesses does not vary on the coating film forming surface 7a without any step. With such a configuration, the coating films having different thickness can be formed on a target transfer bump in the same components, thereby enabling to finely adjust an application quantity of the flux.

Figure 6A:
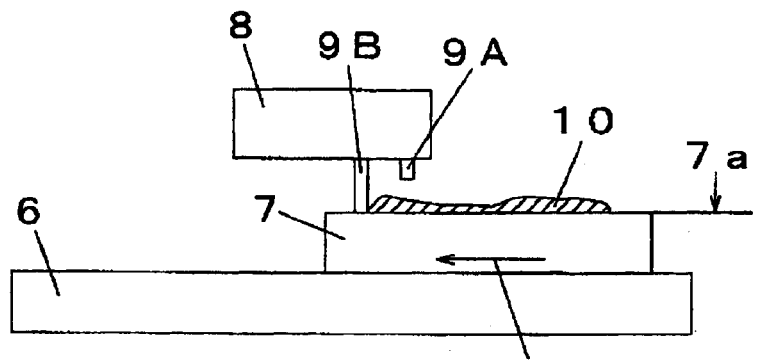
FIGS. 6A to 6D are views illustrating the operations of the paste transfer device in the component mounting apparatus in accordance with the embodiment of the invention.
Figure 6B:
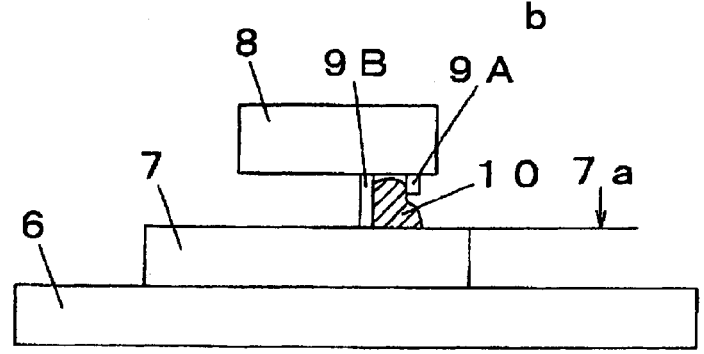

Next, an operation of scraping the flux 10 will be described with reference to FIGS. 6A to 6D. Whenever the flux 10 is transferred to the first components 3 or the second components 4 by the coating film formed on the coating film forming surface 7a using the transfer coating method, the coating film becomes a unusable state because the coating film gets rough. For this reason, it is necessary to scrape the rough coating film so that the coating film can be used for the coating film forming operation. Namely, as shown in FIG. 6A, in the state where the flux 10 is unevenly spread on the coating film forming surface 7a, the second squeegee member 9B is lowered toward the coating film forming surface 7a so as to be in sliding contact with the coating film forming surface 7a, and subsequently the transfer table 7 is moved in a direction of an arrow b. With such a configuration, as shown in FIG. 6B the flux 10 on the coating film forming surface 7a is collected by a scraping operation of the second squeegee member 9B. As a result, the coating film becomes almost the same state as that before starting the coating film forming operation as shown in FIG. 5A.

Figure 6C:
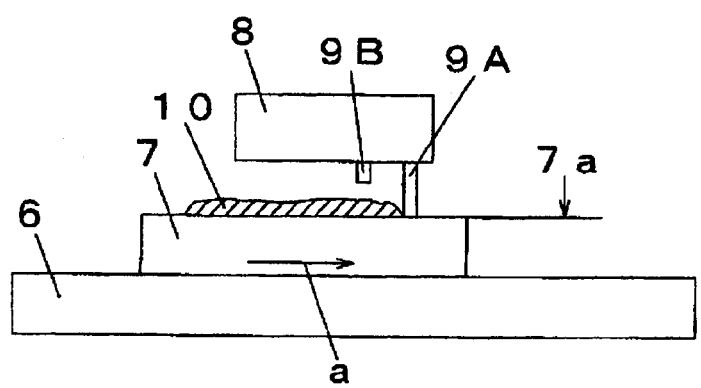
Figure 6D:
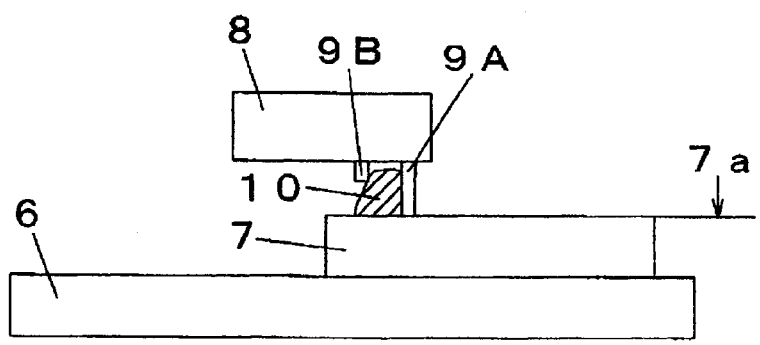

Of course, the flux 10 can be collected by the first squeegee member 9A. As shown in FIG. 6C, in the state where the flux 10 is unevenly formed on the coating film forming surface 7a in the same way as above, the first squeegee member 9A is lowered toward the coating film forming surface 7a so as to be in sliding contact with the coating film forming surface 7a, and subsequently the transfer table 7 is moved in the direction of the arrow a. With such a configuration, as shown in FIG. 6D the flux 10 on the coating film forming surface 7a is collected by a scraping operation of the first squeegee member 9A. Namely, in the embodiment, the first squeegee member 9A and the second squeegee member 9B acting as the coating film forming member are configured to be used for scraping the coating film on the coating film forming surface 7a.

Figure 7A:
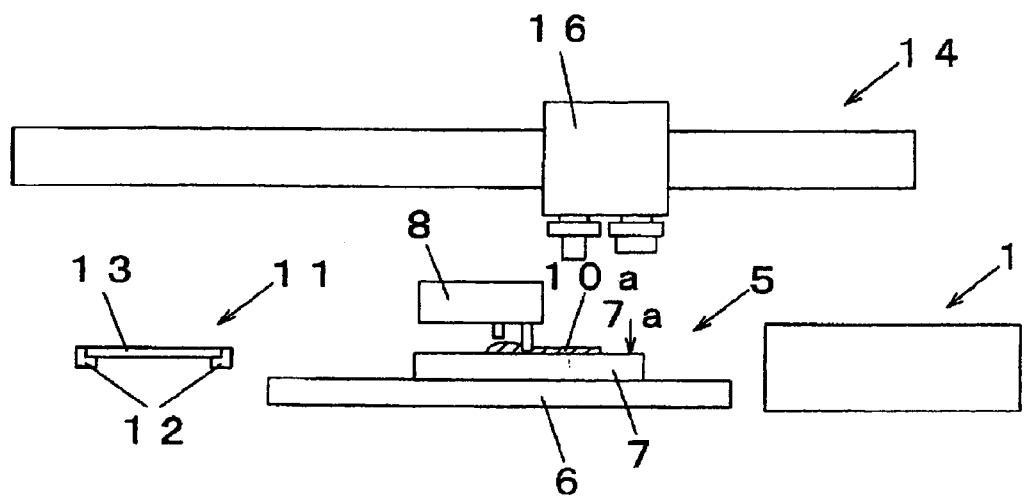
FIGS. 7A and 7B are views illustrating steps of a component mounting method in accordance with the embodiment of the invention.
Figure 7B:
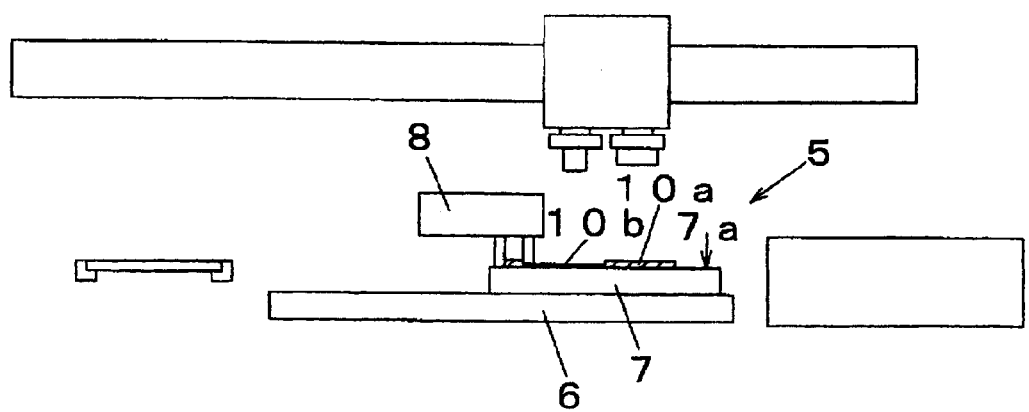

The component mounting apparatus is configured as described above. Next, it will be described about a component mounting method of forming a laminated structure by mounting the first components 3 and the second components 4 on the circuit board 13 using the component mounting apparatus. To begin with, in the paste transfer device 5, the coating film forming operation as described in FIG. 5 is performed, and the paste coating film having the thicknesses set to correspond to the plurality of components is formed (a coating film forming step). Namely, as shown in FIG. 7A, a coating film 10a having the thickness set to correspond to the first components 3 is formed on the coating film forming surface 7a, and subsequently as shown in FIG. 7B, a coating film 10b having the thicknesses set to correspond to the second components 4 is formed on the coating film forming surface 7a.

Figure 8A:
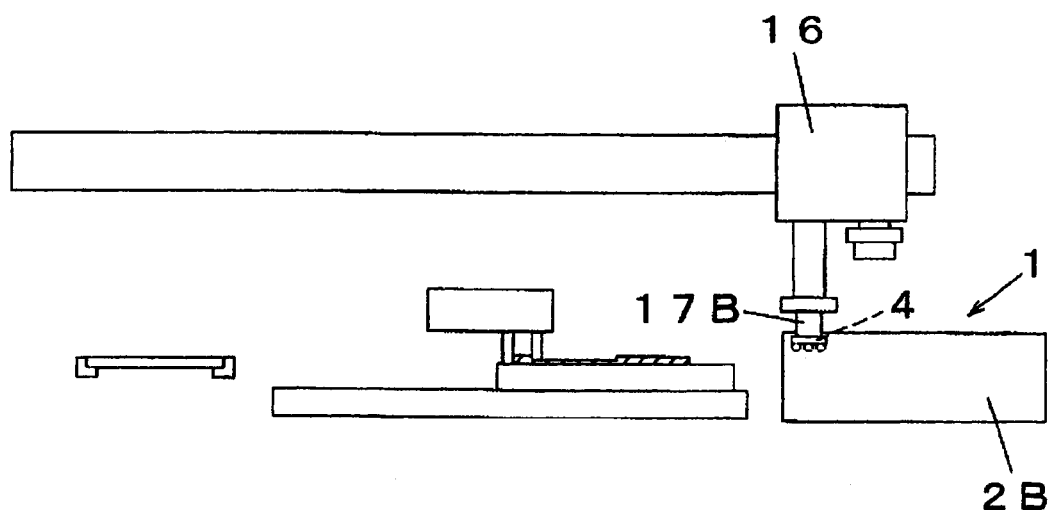
FIGS. 8A and 8B are views illustrating the steps of the component mounting method in accordance with the embodiment of the invention.
Figure 8B:
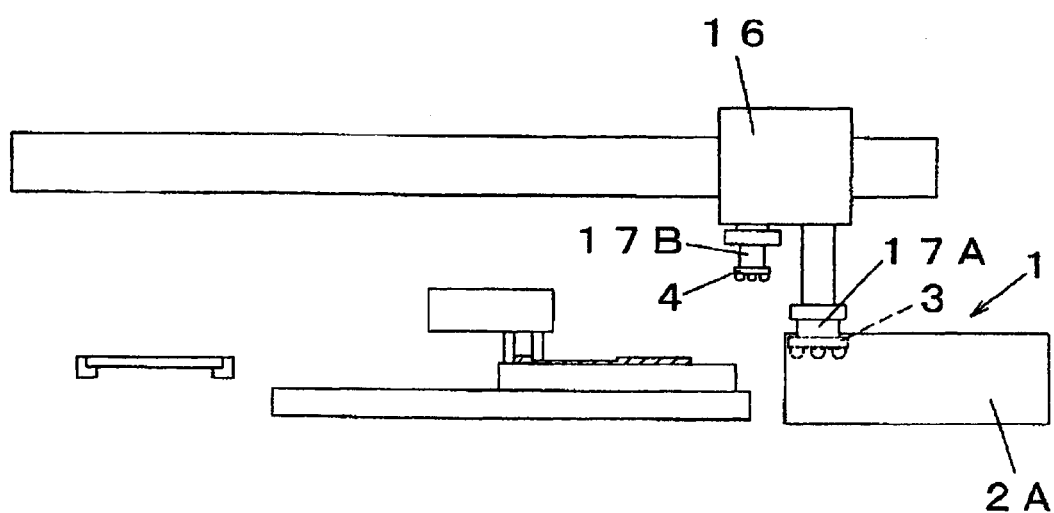

After this, the plurality of first components 3 and second components 4 are picked up from the component supply unit 1 using the placement head 16 (a component pickup step). Namely, as shown in FIG. 8A, the placement head 16 is moved above the component supply unit 1, and above all the second components 4 are picked up from the second components feeder 2B (see FIG. 2 for reference) by the second suction nozzles 17B. Subsequently, as shown in FIG. 8B, the first components 3 are picked up from the first components feeder 2A (see FIG. 2 for reference) by the first suction nozzles 17A.

Figure 9A:
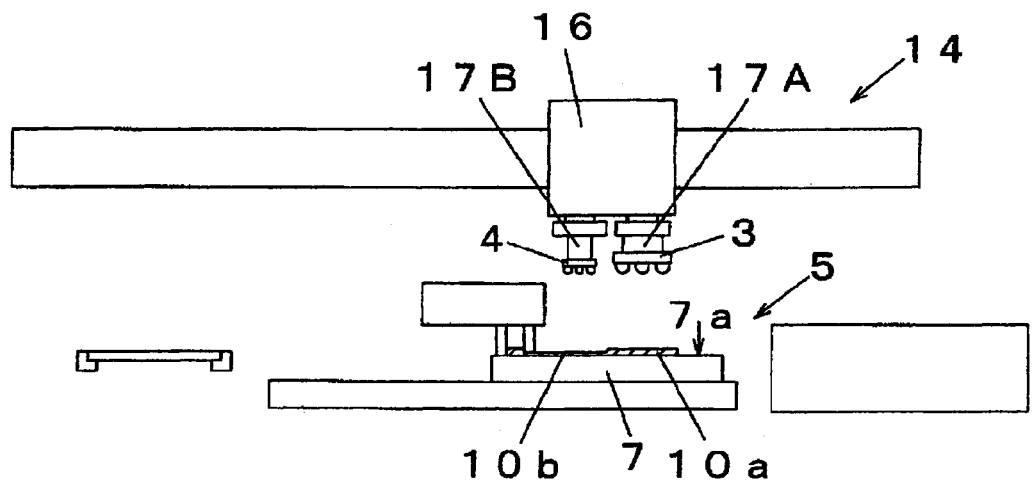
FIGS. 9A and 9B are views illustrating the steps of the component mounting method in accordance with the embodiment of the invention.
Figure 9B:
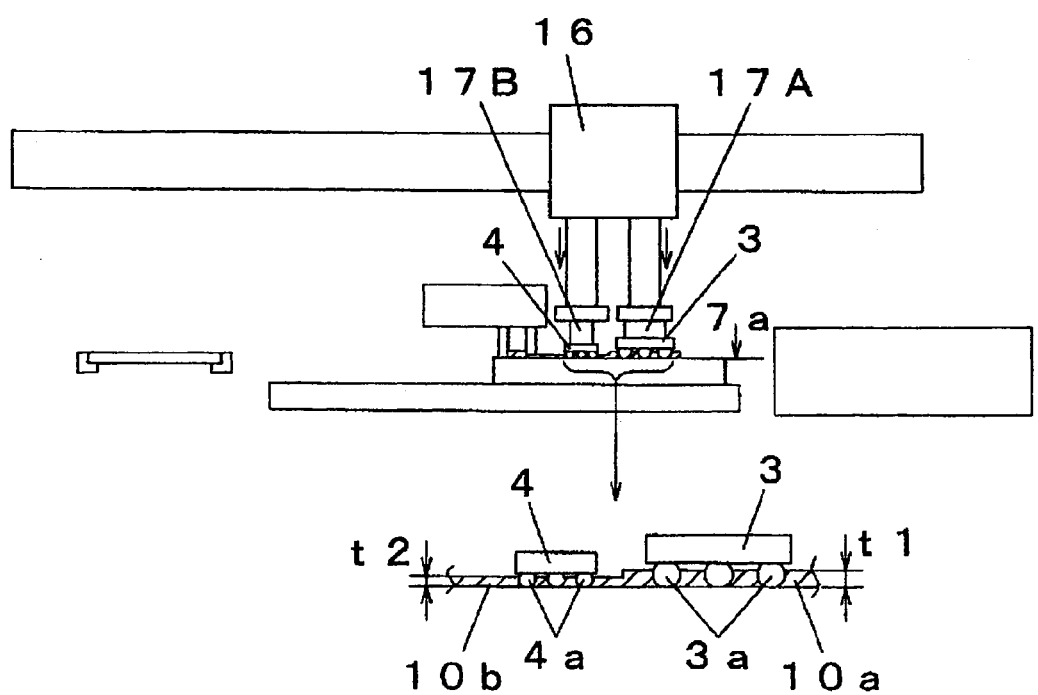

After this, the placement head 16 holding the plurality of first components 3 and second components 4 is moved from the component supply unit 1 to the circuit board holding unit 11. In the course of the movement, as shown in FIG. 9A, the placement head 16 is stopped above the paste transfer device 5, and the first components 3 and the second components 4 are positioned above the coating films 10a and 10b previously formed on the coating film forming surface 7a, respectively. Subsequently, the first suction nozzles 17A and the second suction nozzles 17B are lifted and lowered, whereby the plurality of first components 3 and second components 4 are lifted and lowered relative to the coating film forming surface 7a, whereby the bumps 3a and 4a of the plurality of first components 3 and second components 4 are together provided with the paste 10 using the transfer coating method (a paste transfer step), respectively. Namely, as shown in FIG. 9B, the bumps 3a and 4a of the first components 3 and the second components 4 held by the first suction nozzles 17A and the second suction nozzles 17B are brought into contact with the coating films 10a and 10B formed on the coating film forming surface 7a, respectively.

Figure 10A:
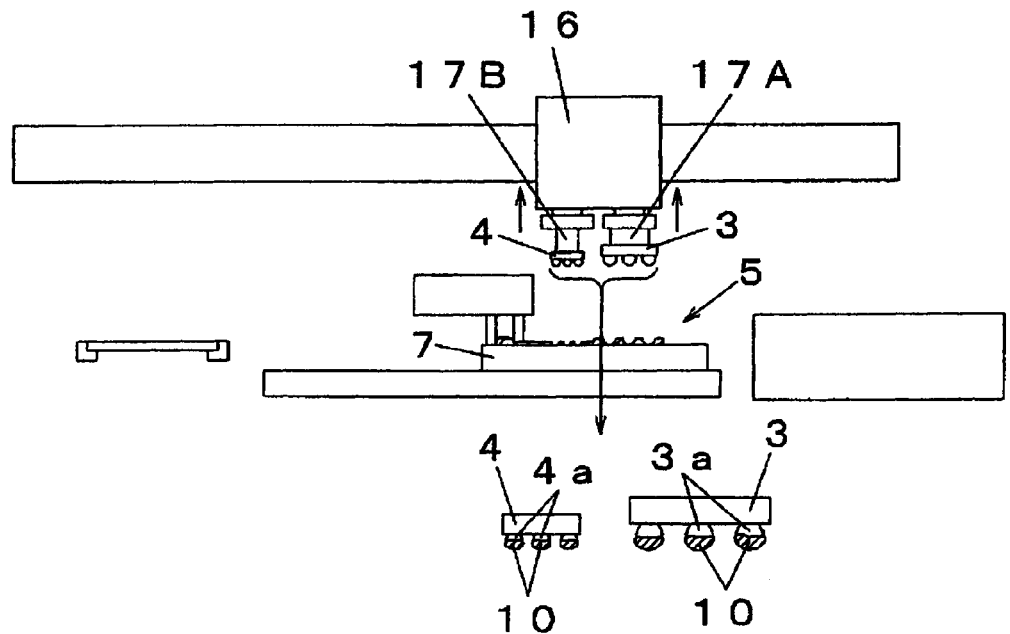
FIGS. 10A and 10B are views illustrating the steps of the component mounting method according to the embodiment of the invention.
Figure 10B:
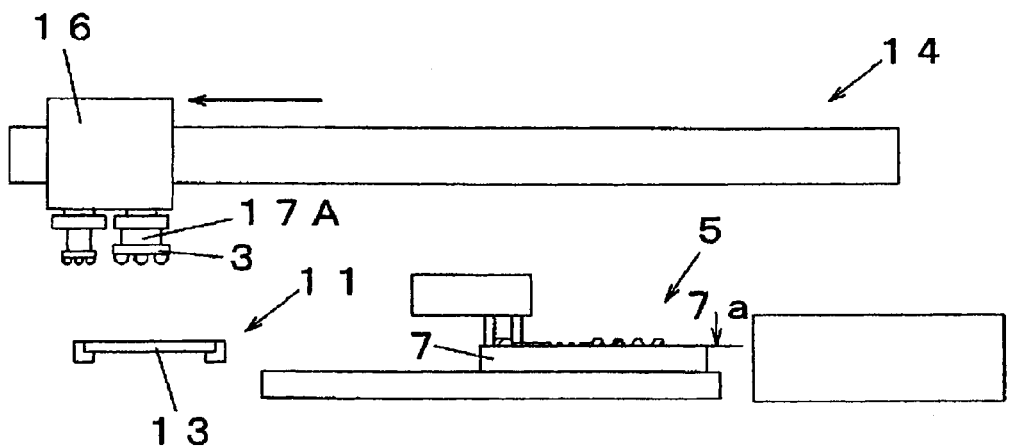

Subsequently, as shown in FIG. 10A, when the first suction nozzles 17A and the second suction nozzles 17B are lifted, it becomes a state that the lower end portions of the bumps 3a and 4a are coated with the flux 10 using the transfer coating method. At this time, since the coating films 10a and 10b having the thicknesses t1 and t2 optimally set to correspond to respective bump sizes of the bumps 3a and 4a are formed on the coating film forming surface 7a, optimal amount of the flux 10 is supplied to the bumps 3a and 4a.

Figure 11A:
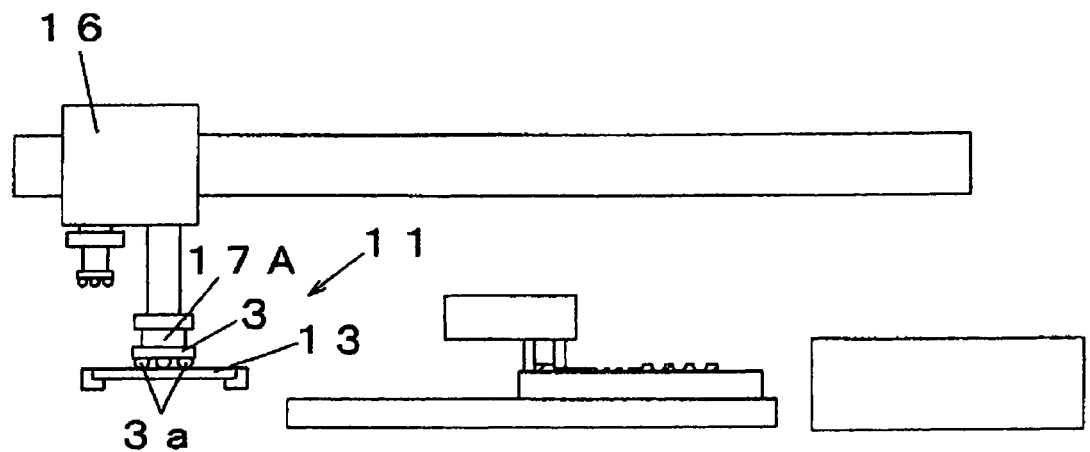
FIGS. 11A and 11B are views illustrating the steps of the component mounting method in accordance with the embodiment of the invention.
Figure 11B:
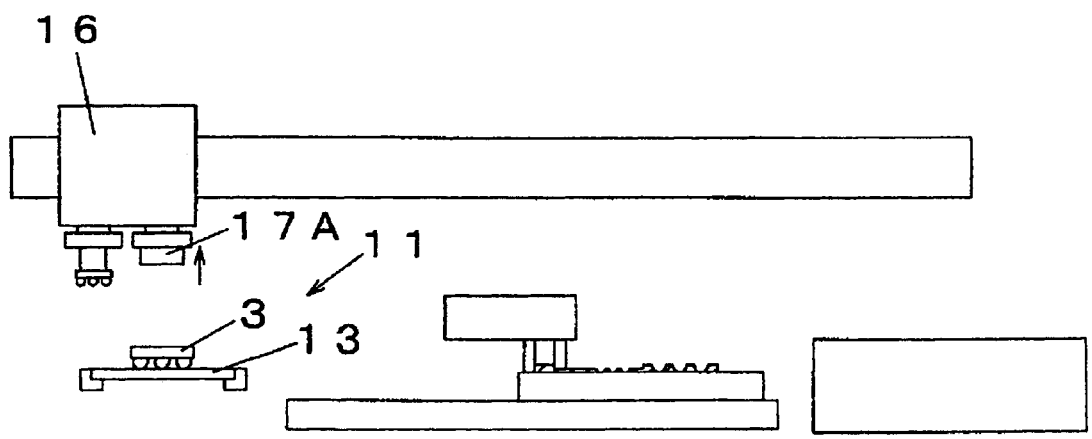
Figure 12A:
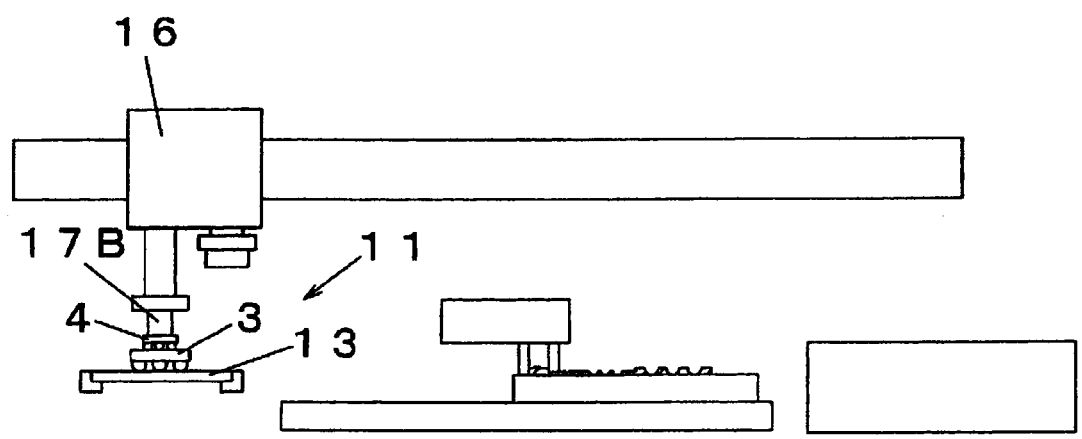
FIGS. 12A and 12B are views illustrating the steps of the component mounting method in accordance with the embodiment of the invention.
Figure 12B:
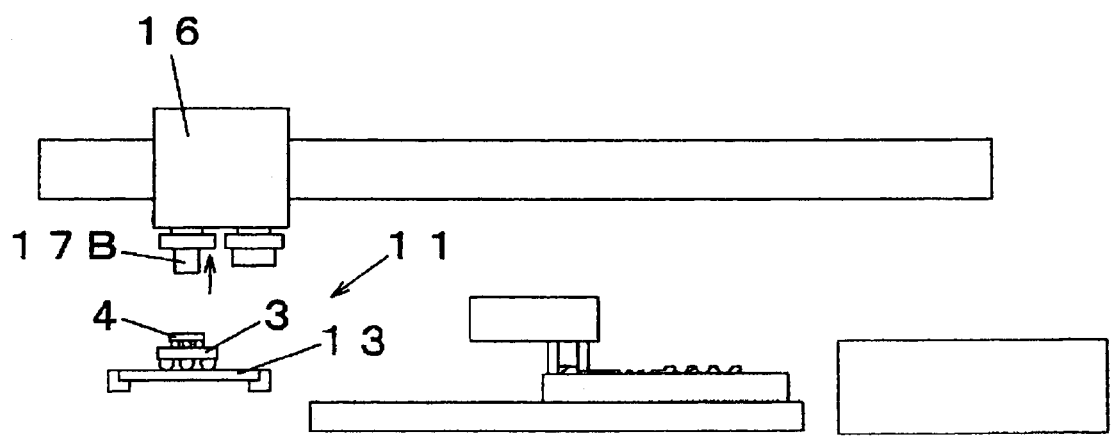

After this, the placement head 16 is moved above the circuit board holding unit 11, and the plurality of first components 3 and second components 4 to which the flux 10 is transferred are placed onto the circuit board 13 (a component placing step). Namely, as shown in FIGS. 11A and 11B, above all the first suction nozzles 17A are fitly positioned at the part mounting positions 13a (see FIG. 2 for reference) of the circuit board 13, and the first components 3 are placed onto the circuit board 13 by lifting and lowering the first suction nozzles 17A. Subsequently, as shown in FIGS. 12A and 12B, the second suction nozzles 17B are fitly positioned at the first components 3 previously placed onto the circuit board 13, and the second components 4 are placed on the first components 3 by lifting and lowering the second suction nozzles 17B. With such a configuration, laminated structures in which the second components 4 to stuck on the first components 3 are formed on the circuit board 13.

After this, the circuit board 13 in which the laminated structures are formed on the components mounting positions 13a are conveyed to a downstream side by a transfer rail 12, and then it is transferred to a reflow device so that a solder bonding is performed by a heating. With such a configuration, the first components 3 are bonded to the circuit board 13 by the bumps 3a using a solder bonding method and the second components 4 are bonded to the first components 3 by the bumps 4a using the solder bonding method. At this time, since an optimal amount of the flux 10 is supplied to the bumps 3a and 4a in correspondence to the bump sizes, a defective bonding caused by an excess or deficiency of an amount of the flux 10 hardly takes place.

As described above, according to the component mounting method of the embodiment, in the components pickup step, after the components are mounted on the circuit board 13 a plurality of components including the first components 3 and the second components 4 constituting the laminated structure are picked up every single mounting turn of the placement head 16. In the paste transfer step, the bumps 3a and 4a of the first components 3 and the second components 4 are brought into contact with the coating films 10a and 10b of the paste having different thicknesses, respectively so that the bumps 3a and 4a are together covered with different amount of the paste. Additionally, in the component placing step, the first components 3 are placed onto the circuit board 13, and then the second components 4 are placed on the first components 3 by stucking with each other, thereby forming the laminated structures. With such a configuration, it is possible to efficiently form the laminated structures by an operation of the single mounting turn in which the placement head 16 is moved from the component supply unit 1 to the circuit board holding unit 11.

Furthermore, according to the embodiment, although an example in which the paste acting as the flux is transferred to the bump formed of the solder is described, the present invention is not limited to an example of such an application, but also may be applied to an application such that a bump formed of metal other than the solder is covered with a junction material of a paste type such as a solder paste or a resin adhesive using the transfer coating method.

A component mounting apparatus and a component mounting method in accordance with the invention have advantages such that coating films having different arbitrary thicknesses are simultaneously formed and a component mounting is efficiently performed with a satisfactory adhesiveness by ensuring an optimal application quantity of a paste, and these are useful for a field that a plurality components in which the bump is formed thereon are mounted on a circuit board.

This application is based upon and claims the benefit of priority of Japanese Patent Application No. 2006-131363 filed on May 10, 2006, the contents of which are incorporated herein by reference in its entirety.

The invention claimed is:

1. A component mounting method of mounting a component on a circuit board using a component mounting apparatus comprising a component supply unit which supplies a plurality of components in which solder bumps are formed on the lower surface thereof; a circuit board holding unit which holds and positions the circuit board; a placement head which picks up the plurality of components from the component supply unit and places the plurality of components onto the circuit board held by the circuit board holding unit; head moving means which moves the placement head to the component supply unit and the circuit board holding unit; and a paste transfer device which is disposed in a movement path of the placement head and supplies a paste with which the solder bumps of the plurality of components held by the placement head are coated using a transfer coating method in the form of at least one coating film having at least two different thicknesses, the paste transfer device further comprising a squeegee unit comprising a squeegee member and a squeegee lifting and lowering mechanism, the component mounting method comprising the steps of:

supplying the paste on a coating film forming surface of the paste transfer device;

moving the squeegee member relative to the coating film forming surface while keeping a gap between a lower end of the squeegee member and the coating film forming surface;

vertically moving the squeegee member, as the paste and the squeegee member move with respect to one another, thereby forming the different thicknesses of the at least one coating film;

picking up the plurality of components from the component supply unit by the use of the placement head;

transferring the paste to the solder bumps of the plurality of components in a bundle by lifting and lowering the plurality of components held by the placement head relative to the paste transfer device in the course of the movement of the placement head holding the plurality of components from the component supply unit to the circuit board holding unit, the solder bumps of at least two of the plurality of components being different in size, each of two different thicknesses configured to correspond to the solder bumps of a different size; and placing the plurality of components to which the paste has been transferred onto the circuit board.

2. The component mounting method according to claim 1, wherein the plurality of components including a first component and a second component constituting a laminated structure after mounting the components are picked up in the step of picking up the components, wherein different amounts of the paste are applied by bringing the bumps of the first component and the second component to be in contact with the at least one coating film having the at least two different thicknesses in the step of transferring the paste, and wherein the laminated structure is formed by placing the first component onto the circuit board and placing the second component to stack on the first component in the step of placing the component.

3. The component mounting method according to claim 1, the method further comprising the step of scraping the paste using the squeegee member and the squeegee lifting and lowering mechanism, and re-forming the at least one coating film with different thicknesses.

* * * * *